Dec. 31, 1968 E. E. CONRAD 3,419,425

METHOD OF SELECTIVELY REMOVING POWDERED GLASS

Filed Oct. 21, 1965

*INVENTOR.*

ERNEST E. CONRAD

*BY*

J W Armbruster

ATTORNEY

United States Patent Office 3,419,425
Patented Dec. 31, 1968

3,419,425
METHOD OF SELECTIVELY REMOVING POWDERED GLASS

Ernest E. Conrad, Clinton Corners, N.Y., assignor to International Business Machines Corporation, Armonk, N.Y., a corporation of New York
Filed Oct. 21, 1965, Ser. No. 499,912
9 Claims. (Cl. 117—212)

ABSTRACT OF THE DISCLOSURE

A glass film is provided on a surface by first coating the surface with a layer of powdered glass. A mask having predetermined openings therein is then placed over the powdered glass layer and a halogenated hydrocarbon and an inert gas is applied to the mask to remove the portions of the powdered glass exposed through such openings. The mask is then removed and the powdered glass is fired to fuse it to a glaze pattern.

This invention relates generally to processes for the selective removal of powdered glass and more particularly to the removal of a pattern of a powdered glass film on an electronic device by the spraying of an halogenated hydrocarbon in an inert gas through a mask.

In the usual process for forming a glass coating on a device, the glass is used in an over-all cover layer and this layer is covered with a photosensitive resist which is selectively removed to provide an etching screen to provide a pattern. The present process differs in that the powdered glass is selectively removed before it is fused. In other words, the glass is deposited as a thin dried layer of powder and when so present in an unfused condition, a metal mask is superimposed to expose only those areas upon which terminals are to be attached or printed circuit lines to be laid, such areas being removed physically by the force of heavy liquid bombardment in a gas stream. After the pattern is formed, the metal mask is removed and then the glass powder is fused to provide a thin holeless layer with only terminal areas exposed ready for the deposition of a metal terminal contact.

An object of the invention is to provide a process for forming holes through thin powdered glass which is a dried outer coating, and to expose contact areas on electronic wafer devices. The powdered glass is applied in a suspension from which the glass powder is first centrifuged on the device and then dried thereon to be retained in a thin even layer. A metal mask with openings registering with the proposed terminal areas and any other pattern of circuitry is then tightly superimposed on the powdered glass layer. Removal is performed through the mask by spraying a mixture of trichloroethylene and nitrogen gas forcibly from an air brush through the openings of the mask to force off the selected areas of powdered glass. After removal, the mask is removed and then the wafer is heated in a furnace to fuse the remaining powdered glass pattern to the electronic wafer.

Another object of the invention is to provide means for deferring a pattern of powdered glass over an electronic device without affecting the underlying materials of the device. In the present process it is possible to examine each stage of the glass removal during and between removal sprayings to insure that the glass powder is selectively removed.

Another object of the invention is to provide a process using a masking step for the selective removal of powdered glass portions without the use of a photoresist.

By the use of the present glass removal process as the initial part, it is possible to define an aluminum pattern on an electronic device while avoiding the etching of the aluminum or the deposition of the aluminum in a pattern through a mask as is found in the prior art. Heretofore, there was the effect of the high temperature accompanying the deposition of the aluminum which tended to affect the dimensions of the mask and to shift the pattern of aluminum. As a result the prior art depositions of aluminum in a pattern causes shortcomings in the shape of lack of definition of the pattern. This is avoided in the present glass removal procedure because now the aluminum may be initially deposited as an over-all pattern and later partially removed with the remaining portion of the powdered glass with the powdered glass pattern being created as defined hereinbefore.

Therefore, it is another object of the invention to remove an aluminum pattern without etching it.

An object of the invention is to provide an aluminum pattern by first forming a negative pattern of powdered glass with an over-all pattern of aluminum. Since the aluminum covers all areas including the underlying pattern of powdered glass, when the powdered glass is removed the aluminum is removed also in the areas overlying the glass. Therefore, the removal of the negative pattern of powdered glass provides the desired pattern of aluminum which is usually over the desired terminal areas and any other lines required by the circuitry. Although the negative pattern of the powdered glass layer is provided by removal through a metal mask, at the time the aluminum is removed there is no such use of the mask and instead the over-all spraying is effective only on those areas having an underlying pattern of powdered glass.

Therefore, it is a still further object of the invention to provide a process for creating a more sharply defined pattern of conductive metal circuitry on an electronic device or printed circuit substrate by first defining a negative pattern of powdered glass, putting down an over-all conductive metal layer thereon, and then removing the powdered glass and the unwanted metal, leaving a design of conductive metal.

The foregoing and other objects, features and advantages of the invention will be apparent from the following more particular description of preferred embodiments of the invention as illustrated in the accompanying drawings.

Figure 1A:
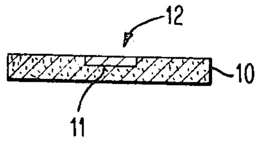
FIGS. 1A to 1F are sectional views representing a portion of semiconductor devices during the various steps in the powdered glass removal process.

Although the invention is illustrated by a plain silicon wafer with a contact area, it is to be realized that such an object is often complicated by the presence of a pattern layer of oxide adherent to the surface of the member and a contact area is a junction area receptive to conductive metal for terminal purposes alone or in conjunction with continuing developed circuit lines as in the case of an integrated circuit.

Referring now more particularly to FIGS. 1A–1F of the drawing, there is represented a series of steps with operations on a fragment of what might be a large array of electronic devices such as semiconductor devices or diodes. A device of this sort would result from the microminiaturization fabrication of such devices and could for example comprise several hundred semiconductor diodes formed on a single semiconductor substrate 10 of a suitable material such as silicon or an intermetallic semiconductor compound. Member 10 has a junction area 11 which is receptive for terminal contact conductive metal.

A problem associated with the showings of FIGS. 1A to 1F are that of forming a passivating or delineating glass surface on the device and still be able to form aperture through the glass to render access for conductive metal to the contact areas. The process steps of FIGS. 1A to 1F may very well be considered as a finished product because the device resulting therefrom may very well be associated in an environment where the needed contact to the contact area is provided as a mechanical probe. However, in a present instance this is followed through by the usual deposition of aluminum as a conductive contact metal and the steps associated with such aluminum deposition are set forth in the views of the drawing of FIGS. 2A to 2H.

Figure 2A:
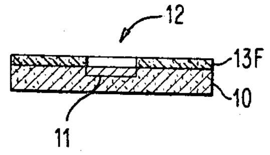
FIGS. 2A to 2H are sectional views representing portions of the devices during the steps for the removal of both powdered glass and aluminum patterns to provide aluminum terminals and circuitry.
Figures 2B, 2C:
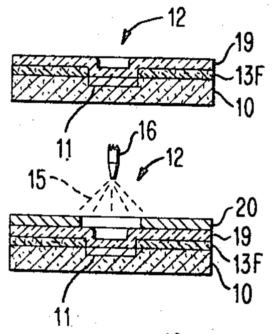

Referring to FIGS. 2A–2H of the drawing, there are shown portions of the wafer which in the first view of FIG. 2A is already coated with the glass pattern of the previous showings and added thereto in the following steps are the necessary procedure for delineating the aluminum pattern. The problem solved in these views of FIGS. 2A to 2H is one of removing part of the aluminum deposition in a pattern without resorting to etching or masking of the aluminum per se and instead relying on the removal of the underlying powdered glass to carry along with it a portion of the aluminum to thus define and accurately delineate a pattern of aluminum on a finished product.

While the various techniques of the prior art have been moderately successful in protecting p-n junctions for some purposes, they have not proved to be as effective as desired for many applications. More particularly the encapsulating procedures have not afforded adequate junction protection for some environments or have resulted in protective jackets that are too bulky for microminiaturization purposes.

Heretofore it has been determined that when a thin adherent silicon dioxide film is produced over the exposed p-n junction or junctions of a semiconductor device, that junction is passivated and becomes fully protected from the action of junction impairing contaminants when a thin impervious coating of glass is chemically bonded to the silicon dioxide film. Semiconductor devices with protected p-n junctions and the techniques for protecting them with silicon dioxide films and chemically bonded glass coatings are disclosed and claimed in the co-pending application of John A. Perri and Jakob Riseman, Ser. No. 141,669, entitled, "Coated Optics and Methods of Providing Protective Coverings Therefor," which has matured into Patent No. 3,247,428, entitled "Coated Objects and Methods of Providing the Protective Coatings Therefor," issue date Apr. 19, 1966, and the co-pending application of William A. Pliskin and Ernest E. Conrad Ser. No. 141,668, entitled "Method of Forming a Glass Film on an Object and the Product Produced Thereby," which has matured into Patent No. 3,212,921, issue date Oct. 19, 1965, both applications having been filed Sept. 29, 1961, and assigned to the same assignee as the present invention. While the procedures disclosed in those cases have been proved to be very satisfactory, the method of the present invention affords advantages to be considered further.

In FIGS. 1A–1F the element to be treated is seen to be the element 10 shown in FIG. 1A. This element is usually a silicon wafer formed with a junction area 11 over which is a contact area 12. However, 10 may also be a form of ceramic substrate to recieve printed circuit wiring as well as terminal contacts for active regions such as the junction region 11.

Figure 1B:
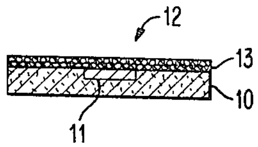

The first step of the process of FIG. 1B is that of applying a thin layer or film of powdered glass 13 on the top surface of the wafer 10. The glass layer may suitably have a thickness of between 7500 and 18,000 angstroms. The powdered glass may be applied as set forth in the co-pending application Ser. No. 141,668 noted hereinbefore or it may be applied as set forth in a later co-pending application, Ser. No. 181,743, entitled, "Method of Forming a Glass Film on an Object," which has matured into Patent No. 3,212,929, issue date Oct. 19, 1965, this application having been filed on Mar. 22, 1962, filed by Pliskin and Conrad and assigned to the same assignee as the present invention. In both of the aforementioned instances, the glass particles are applied in one or more fluids and the holding object is centrifuged to deposit the particles evenly over the substrate. In the present instance, FIG. 1B, the centrifuged glass particles or powder are not immediately fused, but instead a succession of other steps are followed before the glass powder is fired.

Figure 1C:
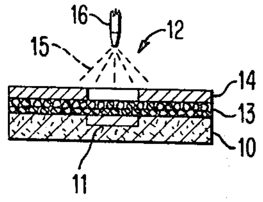

Turning now to the second step shown in FIG. 1C, there it is seen that the mask of metal 14 is placed in intimate contact with the top of the dried powder layer 13 and said mask is formed wtih openings such as the opening directly above the junction 11. After the mask is in position, the upper area of the mask is sprayed with a gas-liquid 15 applied through a gaseous pressure applicator 16 such as an air brush. Although the liquid may be any of a number of heavy liquids such as halogenated hydrocarbons in an inert gas, the preference found in the present invention is in the use of a mixture of trichloroethylene and $N_2$ gas and to have such a mixture directed from an air brush.

Figure 1D:
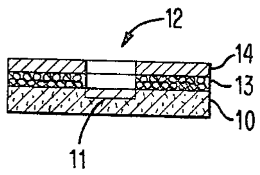
Figure 1E:
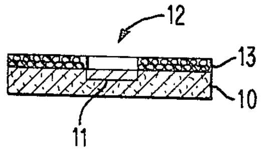
Figure 1F:
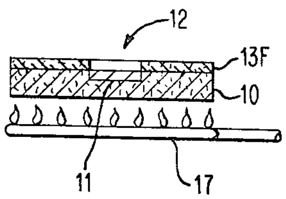

The result produced by the action in FIG. 1C is shown in FIG. 1D where the area 12 is exposed by the removal of the powdered glass film 13 in that certain portion which is not protected by the mask 14. In the following step in FIG. 1E the mask is shown removed so that the substrate 10 and the coating 13 thereon may be further treated as shown in FIG. 1F, there it is seen that heat is applied to fire the glass powder film which then becomes the uniform glass cover 13F which is present over all the substrate upper area except the contact area 12 above the junction 11.

After the series of steps of FIGS. 1A–1F have been completed, the substrate 10 is ready for any number of methods of applying terminals in printed circuitry. However, in this present application a particular one for applying aluminum terminals and circuitry are further illustrated in the showings continuing from FIGS. 2A to 2H.

Before going into detail about the steps of operation defined in FIGS. 2A to 2H, it may be well to note that the ordinary formation of the wafers 10 and 11 may be formed with junction areas and oxide coatings as a part of the substrate 10 by means of process steps set forth in other applications assigned to the same assignee, and these applications are identified as Ser. Nos. 248,530, which has matured into Patent No. 3,300,339, issue date Jan. 24, 1967, and 141,668, which has matured into Patent No. 3,212,921, issue date Oct. 19, 1965.

The second part of this disclosure has to do with the formation of an aluminum pattern over the terminal areas and other portions of the silicon wafer. Although the prior art deals with various ways of providing such aluminum patterns by evaporation through a metal mask, the aluminum in those instances must be deposited at an elevated temperature which causes the metal of the mask to expand and shift locations, and the pattern itself is often shifted to undesirable locations. In the present case, the use of the powdered glass removal and lifting mode of aluminum removal, provides a more definite outline of the pattern and obviates the shifting. In the present instance masking is performed in low temperature surroundings because the etching of the glass through the masking pattern does not require any elevation of temperature. Therefore, the aluminum deposited in an over-all pattern is done so that the high temperature of evaporation but it has no effect on the pattern of the aluminum.

Figure 2D:
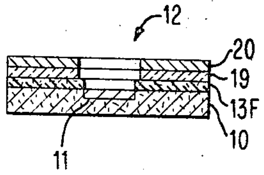
Figure 2E:
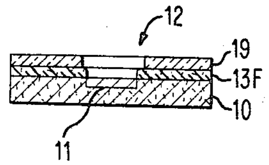
Figures 2F, 2G, 2H:
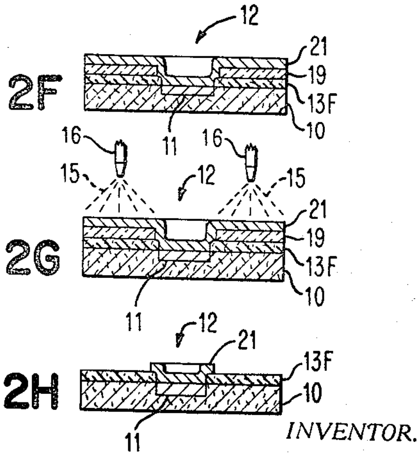

Before starting to describe the various steps in FIGS. 2A to 2H it is well to note that the article 10 in FIG. 2A is the same as the finished product in FIG. 1F, i.e., it is an electronic substrate upon which a film of glass 13F is already fused. Starting with such a silicon wafer or ceramic substrate it is seen that in FIG. 2B another layer of glass particles in a dried form is superimposed as a film 19 covering the entire upper area including the area over the junction contact area 11 as well as the entire pattern of film glass 13F already fused upon the substrate 10. As a second step in this process, a mask 20 is placed firmly upon the dried glass particle layer 19 and this mask is designed to provide openings coinciding with the contact area openings as well as any other printed circuit configurations desired to finally result in places for conductive metal. As part of the masking step FIG. 2C, a gas-liquid 15 is applied much to the same as in the case of FIG. 1C and said gas-liquid is effective to remove part of the powdered glass layer 19 and carry the exposed open area 12 all the way down to the top surface of the junction area 11 as shown in FIG. 2D. There it is seen that the opening through both glass layers, i.e. the fused layer of 13F and the dried powdered layer 19 are carried through the mask 20. When the mask 20 is removed, the appearance of the device is as shown in FIG. 2E. FIG. 2E shows that the substrate 10 is provided with a permanent layer of fused powder glass 13F and a temporary glass powdered layer of dried powder 19. FIG. 2F shows a view illustrating that a layer 21 of evaporated aluminum is deposited as an all-over pattern on the top of the electronic device. After this aluminum coating is put on, a step is followed in FIG. 2G to act upon the underlying powdered glass layer 19 by means of the gas-liquid 15 to undermine the portion of the aluminum layer 21 which is to be removed, and such removal is effected by the uplifting of the dried powdered glass layer by the action of the gas-liquid 15 penetrating through the top of the device and serving to lift off all portions defined by the layer 19. The resulting product is seen in FIG. 2H where the remaining aluminum contact metal 21 is confined to such areas as the terminal contact area 12 directly above the junction area 11 on the substrate 10 and between the open areas of the glazed pattern 13F. Another glaze passivating pattern may be put all over the top of the entire device of FIG. 2H to cover the aluminum terminal 21 as well as all other intersection points between the conductor circuitry and the underlying protective coatings.

While the invention has been particularly shown and described with reference to preferred embodiments, it will be understood by those skilled in the art that the foregoing and other changes in the form and details may be made therein without departing from the spirit and scope of the invention.

What is claimed is:

1. The method of covering a surface of a device with a protective glass film comprising, the steps of:

coating said surface with a layer of powdered glass, applying a mask having predetermined openings therethrough over said powdered glass layer, applying a halogenated hydrocarbon and an inert gas to said mask to remove the portions of said powdered glass exposed through said openings, and removing said mask and firing said powdered glass to fuse it to a glaze pattern.

2. A method of coating the surfaces of objects with a protective glass film having a predetermined pattern comprising the steps of:

centrifuging a powdered glass in a liquid suspension onto the surface of the object, drying said glass coated object, masking the object with a metal mask having a predetermined pattern, removing the exposed powdered glass by spraying said masked object with a mixture of a halogenated hydrocarbon and an inert gas, and removing said mask from said coated object and firing said coated object to fuse said powdered glass and produce a coating glass film of a desired design.

3. A method of coating the surface of a silicon wafer with a protective glass film having a predetermined pattern comprising the steps of:

centrifuging a layer of powdered glass of about a thickness of between 7500 and 18,000 angstroms onto the surface of the wafer, drying said glass coated wafer, masking the wafer with a metal mask having a predetermined pattern to expose terminal areas and other circuitry areas, removing the exposed powdered glass by spraying said mask wafer with a mixture of trichloroethylene and nitrogen gas directed from an air brush, removing said mask from the coated wafer and firing said wafer to fuse said powdered glass in a pattern of film exposing terminal and circuitry areas.

4. The method of covering the surface of an electronic device having terminal areas to be exposed comprising the steps of:

coating the entire area of said surface with a layer of powdered glass in a liquid suspension, centrifuging said device to deposit the powdered glass in a thin uniform layer, drying said layer to hold the powdered glass in place, applying a mask formed with openings coinciding with said terminal areas, applying a halogenated hydrocarbon and an inert gas through said mask to remove the powdered glass in the areas over said terminal areas, removing said mask and firing said device to glaze the pattern of glass coating.

5. The method of forming a conductive metallic pattern on a device comprising the steps of:

forming a negative powdered glass pattern on the device, depositing a film of said metal on the entire surface of the device and said powdered glass, and physically removing said glass pattern by the application to said pattern of a halogenated hydrocarbon and an inert gas to consequently remove therefrom the overlying portion of said metal and leave behind the desired metal pattern.

6. The method of forming a conductive metallic pattern on a device comprising the steps of:

forming a fired negative glass pattern on the device, forming a second powered glass unfired negative glass pattern on the device, depositing a film of said metal over the surface of said device, and physically removing said powdered unfired glass pattern by the application to said pattern of a halogenated hydrocarbon and an inert gas to consequently remove the overlying portion of said metal and form a desired adhering metal pattern on said device.

7. A method of masking a substrate on which is evaporated a metal film comprising the steps of:

depositing powdered glass particles over the surface of the substrate by centrifuging, masking the powdered glass layer with a metal mask having chosen openings therein, spraying the powdered glass layer exposed through said openings with a gas-liquid stream comprising a halogenated hydrocarbon and an inert gas to remove said exposed powdered glass, evaporating a metal film onto the exposed surface of the substrate, and spraying the residual powdered glass layer with said gas liquid stream thereby removing said residual glass layer and the overlying metal film, whereby there remains a well-defined pattern of the evaporated metal film.

8. A method of forming an aluminum pattern of terminals on a silicon wafer with a fired glass pattern exposing terminal areas comprising the steps of:

depositing an unfired glass powder layer on said wafer, masing said powered glass layer with a mask having predetermined openings therethrough to register with said terminal areas, removing said powdered glass over said terminal areas with a halogenated hydrocarbon and an inert gas, evaporating an aluminum film onto the entire surface of said wafer, spraying the residual powdered glass layer with a gas-liquid stream of a hydrogenated hydrocarbon and an inert gas to remove said layer and the overlying aluminum, whereby there remains aluminium terminal areas therefrom on the top of said wafer.

9. A method of forming an aluminum pattern of terminals on an integrated circuit substrate bearing active electronic devices with exposed terminals comprising the steps of:

centrifuging a layer of powdered glass particles on said substrate, drying said powdered glass layer, masking said glass layer with a mask having chosen openings therethrough for predetermining the locations of said terminals and said circuitry, spraying the glass layer with a halogenated hydrocarbon-inert gas stream to remove the glass exposed through said openings, depositing a film of aluminum on the resulting sprayed glass layer, and employing a second spraying operation to remove the remainder of the glass and that portion of the aluminum overlying said remainder of said glass.

References Cited

UNITED STATES PATENTS 1,898,500 2/1933 Schulz ------------ 117—40 X

ALFRED L. LEAVITT, *Primary Examiner.*

C. K. WEIFFENBACH, *Assistant Examiner.*

U.S Cl. X.R.

117—5.5, 8.5, 217, 101, 107, 227